MAGNESIUM-ALUMINUM ALLOY CONTACTS
FOR SEMICONDUCTOR DEVICES
Filed Sept. 9, 1965

INVENTORS
TSUTOMU MAJIMA
KOICHI URUSHIDA
BY
Hopgood & Calimafde
ATTORNEYS 3,353,073

MAGNESIUM-ALUMINUM ALLOY CONTACTS FOR SEMICONDUCTOR DEVICES

Tsutomu Majima and Koichi Urushida, Tokyo, Japan, assignors to Nippon Electric Company Limited, Tokyo, Japan, a corporation of Japan Filed Sept. 9, 1965, Ser. No. 486,027
Claims priority, application Japan, Sept. 10, 1964, 39/51,648
4 Claims. (Cl. 317—234)

ABSTRACT OF THE DISCLOSURE

A lead attachment arrangement for a semiconductor element which employs an aluminum electrode on the element and a magnesium-aluminum alloy conductor bonded to the electrode to facilitate the conductor connection process and to provide a more reliable connection between the conductor and the electrode.

This invention relates to a semiconductor device structure, and more particularly to a lead attachment structure which plays an extremely important role in the structure, assembly and performance of the device.

As those knowledgeable in the art are aware, a semiconductor device comprises a semiconductor element, a housing to encapsulate the element hermetically, external lead wires sealed by an insulating material, and connecting wires which provide electrical connection between each of the external lead wires and each of the electrodes of the semiconductor element. In a diffused semiconductor element having a PN junction with an N type or P type region formed within one surface of the element, aluminum is often used as an electrode material because it is easily vacuum-evaporated and forms good ohmic contacts. As the electrode areas are relatively small, electrical connections thereto are formed with fine connecting wires by means of thermocompression bonding, ultrasonic welding or the like, the former being preferred because of its simple operation, efficiency, and simple equipment required.

It has been common practice in the art of semiconductor device manufacture, and more particularly in the art of diffused semiconductor device manufacture, to use pure metals such as gold and aluminum for the connecting wires in the thermocompression bonding process. At the bonded portion, however, of a gold wire-aluminum electrode system, a gold-aluminum intermetallic compound is formed when the system is stored or operated at 150° C. or higher for a long time period, inducing mechanical brittleness in the system. It has been a major disadvantage in the yield of semiconductor device manufacture and in device reliability that electrical connections using gold connecting wires may be broken by slight internal strain or external shock as a result of the aforementioned brittleness. On the other hand, when an aluminum wire-aluminum electrode system is utilized, though the aforementioned gold-aluminum alloy is not formed at the bonded portion, it is impossible to obtain sufficient adhering strength between a connecting wire and an electrode, despite careful control of the aluminum thickness of the aluminum deposition process, and of the various other factors which are necessary to perform thermocompression bonding in a stable and reliable manner.

Accordingly, it is an object of this invention to provide a semiconductor device structure which is not subject to the disadvantages referred to above.

Figure 1:
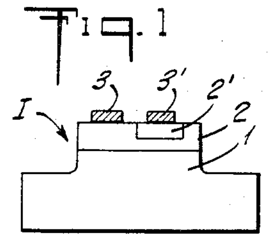
Figure 4:
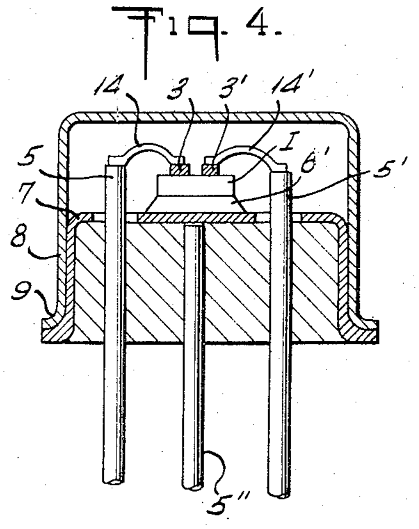
Figure 2:
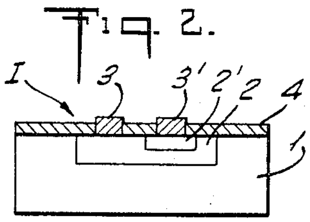
Figure 5:
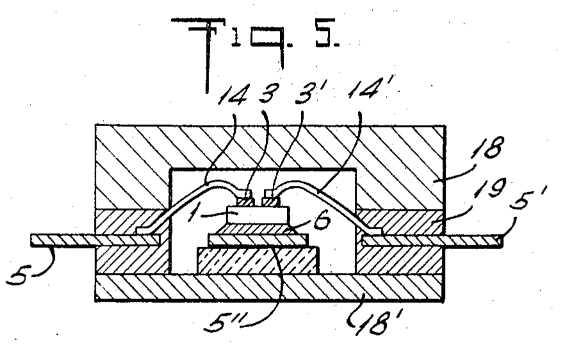
Figure 3:
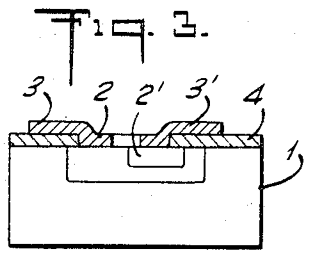

All of the objects, features and advantages of this invention and the manner of attaining them will become more apparent and the invention itself will be best understood by reference to the following description of an embodiment of the invention taken in conjunction with the accompanying drawing, in which:

FIGS. 1, 2 and 3 are cross-sectional views of semiconductor elements used in the present invention, and FIGS. 4 and 5 show cross sectional views of different embodiments of the invention.

In the present invention the semiconductor device utilizes an improved connecting wire material in order to enable easy, reliable and thermally stable thermocompression bonding of connecting wires, providing the results of improved manufacturing yield and improved reliability of the device.

In the present invention, as a first arrangement, we employed a connecting wire with aluminum as its major constituent so that the aforementioned intermetallic compound does not form or grow between the connecting wire and aluminum electrode during storage or operation at a relatively high temperature, and so that metallic bonding with a mono-metallic composition is predominantly formed between the connecting wire and the aluminum electrode.

Secondly in the present invention, we utilized as the connecting wire material an aluminum alloy containing aluminum as its major constituent and magnesium therewith, so that the connecting wires have the desired increased tensile strength and elongation characteristics in order to assure thermocompression bonding of the fine connecting wires to the aluminum electrode on the semiconductor element surface. The present invention, therefore, provides a stable semiconductor device comprising an aluminum electrode deposited on one major face of a semiconductor element in order to provide electric contact with the element, said face having an N or P type region formed therein, and a wire of aluminum alloy containing a small amount of magnesium providing connection between the aluminum electrode and the external lead wire means, the aluminum electrode and connecting metal being bonded by thermocompression.

Referring now to FIG. 1, there is shown a mesa type transistor element I for use in the semiconductor device of the present invention, having a collector 1 with a base region 2 and emitter region 2′ formed by diffusion in one major face thereof, each of the regions having aluminum for a base electrode 3 and for an emitter electrode 3′.

FIG. 2 shows a planar type transistor element I for use in the present invention, having the emitter and collector junctions formed by diffusion, with the surface including portions of the junctions exposed to the surface passivated with an insulating film 4.

FIG. 3 shows a diffused transistor element I similar to that of FIG. 2 having the exposed portions of the junctions also passivated with an insulating film 4, and having the base electrode 3 and emitter electrode 3′ extending over the surface of the insulator 4. Such a structure is frequently utilized where an element with small base and emitter electrode areas is required.

FIG. 4 shows in cross-section a first embodiment of the invention in which a transistor element I of FIGS. 1, 2 or 3 is fixed to a header 7 by means of solder 6, providing the collector connection to an external lead wire 5″. The solder material is preferably an eutectic alloy, formed between gold and semiconductor in contact with each other by heating the materials in an inert gas, such as, for example, nitrogen. Wires of aluminum alloy 14 and 14′ containing a small amount of magnesium are then thermocompression-bonded to aluminum electrodes 3 and 3′ on the element and to external lead wires 5 and 5′, providing the base and emitter connections. Finally, the device is encapsulated by means such as a cap 8 and sealed at the brim 9 thereof. It is desirable to have the contact portion of the header 7 and leads 5 and 5' gold plated or silver plated to facilitate connection thereof.

FIG. 5 shows in cross-section a second embodiment of the invention in which a transistor element I of FIGS 1, 2 or 3 is directly attached to an external lead wire 5'' with solder 6, to provide the collector contact. The element is then hermetically sealed with glass 19 between ceramic components 18 and 18' so arranged as to encapsulate the same, base, emitter and collector lead wires 5, 5' and 5'' extending through the glass 19. In the second embodiment the thermocompression bonding of the wires 14 and 14' of aluminum alloy containing magnesium to the external lead wires 5 and 5' and the electrodes 3 and 3' of the element must be performed prior to melting of the glass for the hermetic sealing process. When the coefficients of thermal expansion and/or the desired anticorrosiveness of the ceramic, lead wires, etc. requires the use of high sealing temperature glass, such as that which softens, for example, at 450° C.–600° C., it is desirable to have the bonded portion of the external lead wire so located as to be fixed by the sealing glass as shown in the drawing. This is desirable because of the formation of a mechanically brittle alloy between the gold or silver plating on the surface of the external lead wires and the connecting wires of aluminum alloy.

It will be advantageous to employ the structure described in Japanese utility model application No. 38/97,865 entitled, "Semiconductor Device," invented by the inventors of the present invention, to the second embodiment shown in FIG. 5. The structure of connecting wire bonding which is the most important aspect of this invention is very effective in the bonded portion of the aluminum alloy wire and aluminum electrode deposited on the semiconductor element.

The thickness of the aluminum film evaporated and deposited on the semiconductor element is determined by the current capacity requirements of the finished device, the masking effect of the photolithography process, and the stability of the deposition process. The thickness is usually in the range of 0.3–2.0 microns. The thickness of the connecting wire is determined by the shape and area of the aluminum electrode on the element, and the structure and size of the device. In general practice, connecting wires having diameters of 15–100 microns are most common.

Thermocompression bonding of a connecting wire to an aluminum electrode is performed by pressing with a compression jig a connecting wire placed on the aluminum electrode, causing plastic deformation. In such a process the oxide and other heterogeneous substance ordinarily existing between the aluminum electrode and connecting wire at the contact portion must be broken in order to make a clean metallic contact so as to provide a strong bond. As stress must be delivered to a thin aluminum electrode in order to cause desired plastic deformation therein through a thick connecting wire, it is desirable to use a connecting wire with high tensile strength and elongation percentage. More specifically, the connecting wire must give to the aluminum electrode a stress sufficient to cause plastic deformation and at the same time the wire itself must have a characteristic of sufficient plastic deformation. As an example of a characteristic of aluminum alloy wire according to the present invention, a wire with a 25 micron diameter and having 2.5% magnesium contained therein has a rupture weight of approximately 12 grams and an elongation percentage of approximately 6%, whereas a fully annealed pure aluminum wire having a 25 micron diameter has a rupture weight of approximately only 1.5 grams and an elongation percentage of approximately only 1.6%. As an example of the compression force which gives approximately the same plastic deformation to the above wires, when a wedge type compression jig of the same shape and size is used, 12 grams of weight is sufficient for the pure aluminum wire and at least 20 grams of weight is necessary for the magnesium containing aluminum alloy wire. Although the tensile strength and elongation percentage increase generally proportionally with the magnesium content it is desirable that the magnesium content be small, i.e., such as of the order of approximately 0.5%–7%, from the standpoint of manufacturing the connecting wire, and also from the standpoint of the allowable compression force on the semiconductor element.

The increased tensile strength provided by the alloy wire as described above also provides advantages of easy manufacture and handling of the wire. It has also been found that pure aluminum wire is adhesive to the compression jig due to excessive deformation experienced in obtaining the desirable bonding strength, however, such disadvantage is eliminated by using the aluminum alloy wire in accordance with the present invention.

Accordingly, it will be appreciated that the manufacture of semiconductor devices having connecting wire bonding structures in accordance with this invention is facilitated, with the further advantage of improved yield and thermal stability, as well as high reliability and extremely efficient operation.

Although the present invention has been described referring to specific embodiments of transistors, it is easily applied to, for example, diodes and integrated circuits and the connecting wire may be in ribbon like or other suitable shape. Therefore, it will be appreciated that variations of the present invention will be apparent to those skilled in the art and that the present invention is to be limited only by the spirit and scope of the appended claims.

What is claimed is:

1. An improved lead arrangement for a semiconductor element comprising a conductor of aluminum alloy consisting of 0.5 to 7% magnesium with the balance aluminum and said conductor being bonded to an aluminum electrode formed on the semiconductor element.

2. A semiconductor device comprising
a semiconductor element,
an aluminum electrode on a face of said element to provide electrical contact therewith,
an aluminum alloy conductor consisting of a small amount of magnesium, the balance aluminum for providing an electrical connection between said electrode and an external lead wire means.
and said conductor being bonded to said electrode by thermocompression.

3. A semiconductor device comprising
a semiconductor element,
an aluminum electrode on a face of said element to provide electrical contact therewith,
lead wire means,
a conductor comprising an alloy consisting of a small amount of magnesium and the balance aluminum,
said conductor forming an electrical path between said electrode and said lead wire means,
and said conductor being bonded to said electrode and to said lead wire means.

4. The invention described in claim 3, wherein the amount of magnesium in said alloy is generally in the range of 0.5% to 7%, whereby the tensile strength and elongation percentage of said conductor are substantially increased over the values of such characteristics exhibited by a conductor comprising pure aluminum.

References Cited

UNITED STATES PATENTS 3,259,973 7/1966 Quass ______________ 29—504

OTHER REFERENCES

IBM Technical Disclosure Bulletin, vol. 7, No. 6, November 1964, p. 531.

JOHN W. HUCKERT, *Primary Examiner.*

R. F. POLISSACK, *Examiner.*